(12) United States Patent
Lee et al.

(10) Patent No.: US 12,557,209 B2
(45) Date of Patent: Feb. 17, 2026

(54) PRINTED CIRCUIT BOARD HAVING CUTTING POSITION IDENTIFICATION MARK AND ALIGNMENT MARK AND SEMICONDUCTOR PACKAGE HAVING THE SAME

(71) Applicant: Samsung Electronics Co., Ltd., Suwon-si (KR)

(72) Inventors: Kanggyune Lee, Suwon-si (KR); Hyunggil Baek, Suwon-si (KR); Youngja Kim, Cheonan-si (KR); Seungjin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 481 days.

(21) Appl. No.: 18/071,903

(22) Filed: Nov. 30, 2022

(65) Prior Publication Data
US 2023/0180381 A1  Jun. 8, 2023

(30) Foreign Application Priority Data

Dec. 2, 2021 (KR) .......................... 10-2021-0171199

(51) Int. Cl.
*H05K 1/02* (2006.01)
*H01L 23/498* (2006.01)
(Continued)

(52) U.S. Cl.
CPC ...... *H05K 1/0269* (2013.01); *H01L 23/49816* (2013.01); *H01L 23/49822* (2013.01); *H01L 23/49838* (2013.01); *H01L 23/544* (2013.01); *H01L 25/105* (2013.01); *H01L 2223/54426* (2013.01); *H01L 2225/1023* (2013.01); *H01L 2225/1058* (2013.01); *H01L 2225/1082* (2013.01); *H05K 1/113* (2013.01); *H05K 2201/09936* (2013.01)

(58) Field of Classification Search
CPC ............ H05K 1/0269; H01L 23/49816; H01L 23/49822; H01L 23/49838; H01L 23/544; H01L 25/105
See application file for complete search history.

(56) References Cited

U.S. PATENT DOCUMENTS 7,944,064 B2   5/2011   Wakisaka et al.
8,053,910 B2   11/2011  Terashima et al.
(Continued)

FOREIGN PATENT DOCUMENTS

JP   2011-029279 A   2/2011
JP   2014-096469 A   5/2014
(Continued)

*Primary Examiner* — Michael Jung
(74) *Attorney, Agent, or Firm* — Muir Patent Law, PLLC

(57) ABSTRACT

A printed circuit board includes a substrate base; a plurality of ball lands arranged on a surface of the substrate base; a cutting position identification mark disposed on a corner of the surface of the substrate base; and at least one alignment mark disposed on the surface of the substrate base to be spaced apart from the ball lands and exposed to the outside, wherein top surfaces of the ball lands and a top surface of the at least one alignment mark are at substantially the same vertical level and the ball lands and the at least one alignment mark include the same material.

18 Claims, 16 Drawing Sheets

(51) Int. Cl.
    *H01L 23/544*     (2006.01)
    *H01L 25/10*     (2006.01)
    *H05K 1/11*     (2006.01)

(56) References Cited

U.S. PATENT DOCUMENTS

| | | |
|---|---|---|
| 9,064,873 B2 | 6/2015 | Miao et al. |
| 9,117,826 B2 | 8/2015 | Kinoshita |
| 9,196,608 B2 | 11/2015 | Foong et al. |
| 9,355,859 B2 | 5/2016 | Yanagisawa |
| 9,865,574 B2 | 1/2018 | Huang et al. |
| 10,068,881 B2 | 9/2018 | Kwon |
| 10,522,473 B2 | 12/2019 | Huang et al. |
| 10,636,757 B2 | 4/2020 | Yang et al. |
| 2008/0284048 A1 | 11/2008 | Kim et al. |
| 2014/0284780 A1* | 9/2014 | Kinoshita ............. H01L 23/481 257/676 |
| 2016/0172287 A1* | 6/2016 | Arisaka ................. H05K 1/181 257/774 |
| 2017/0047296 A1* | 2/2017 | Watanabe ............. H01L 23/562 |
| 2017/0084544 A1* | 3/2017 | Chen ..................... H01L 23/544 |
| 2019/0385975 A1* | 12/2019 | Wang ..................... H01L 24/24 |
| 2020/0343192 A1* | 10/2020 | Aoki .................... H01L 23/5384 |
| 2023/0187372 A1* | 6/2023 | Hung ..................... H01L 24/05 257/774 |

FOREIGN PATENT DOCUMENTS

| | | |
|---|---|---|
| KR | 101383072 B1 | 4/2014 |
| KR | 1020170080927 A | 7/2017 |

* cited by examiner

PRINTED CIRCUIT BOARD HAVING CUTTING POSITION IDENTIFICATION MARK AND ALIGNMENT MARK AND SEMICONDUCTOR PACKAGE HAVING THE SAME

CROSS-REFERENCE TO RELATED APPLICATION

This application is based on and claims priority under 35 U.S.C. § 119 to Korean Patent Application No. 10-2021-0171199, filed on Dec. 2, 2021, in the Korean Intellectual Property Office, the disclosure of which is incorporated by reference herein in its entirety.

BACKGROUND

The present disclosure relates to a printed circuit board and a semiconductor package including the same, and more particularly, to a printed circuit board having an alignment mark and a semiconductor package including the same.

Recently, in the electronic product market, the demand for portable devices has rapidly increased, and thus, miniaturization and weight reduction of electronic components mounted in these electronic products are continuously demanded. For miniaturization and weight reduction of electronic components, semiconductor packages mounted therein are demanded to process high-capacity data while volumes of the semiconductor packages are gradually reduced. Since semiconductor chips constituting such a semiconductor package are mounted on a printed circuit board, it is very important for the reliability of a product to accurately capture defects of a printed circuit board in a semiconductor package and to derive a suitable solution.

SUMMARY

The present disclosure provides a printed circuit board having an alignment mark that enables accurate detection of defects that may occur during a process of cutting the printed circuit board and a semiconductor package including the printed circuit board.

In addition, the technical goals to be achieved by the disclosed embodiments are not limited to the technical goals mentioned above, and other technical goals may be clearly understood by one of ordinary skill in the art from the following descriptions.

According to an aspect of the inventive concept, there is provided a printed circuit board including a substrate base; a plurality of ball lands arranged on a surface of the substrate base; a cutting position identification mark disposed on a corner of the surface of the substrate base; and at least one alignment mark disposed on the surface of the substrate base to be spaced apart from the ball lands and exposed to the outside, wherein top surfaces of the ball lands and a top surface of the at least one alignment mark are at substantially the same vertical level and the ball lands and the at least one alignment mark include the same material.

According to another aspect of the inventive concept, there is provided a printed circuit board for a semiconductor package, the printed circuit board comprising a substrate base in which a plurality of wiring layers are vertically stacked; a plurality of ball lands arranged at a bottommost layer of the wiring layers; and at least one alignment mark disposed at the bottommost layer of the wiring layers to be spaced apart from the ball lands, wherein the at least one alignment mark is exposed to the outside, and the at least one alignment mark enables checking of a center point of the printed circuit board with one alignment mark alone or with two or more neighboring alignment marks together.

According to another aspect of the inventive concept, there is provided a semiconductor package including a printed circuit board having a top surface and a bottom surface; a semiconductor chip mounted on the top surface of the printed circuit board; a plurality of ball lands located on the bottom surface of the printed circuit board; a plurality of solder balls attached to the ball lands; a cutting position identification mark disposed at one corner of the bottom surface of the printed circuit board; and at least one alignment mark disposed on the bottom surface of the printed circuit board to be spaced apart from the ball lands and exposed to the outside, wherein bottom surfaces of the ball lands and a bottom surface of the at least one alignment mark are at substantially the same vertical level and the ball lands and the at least one alignment mark include the same material.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
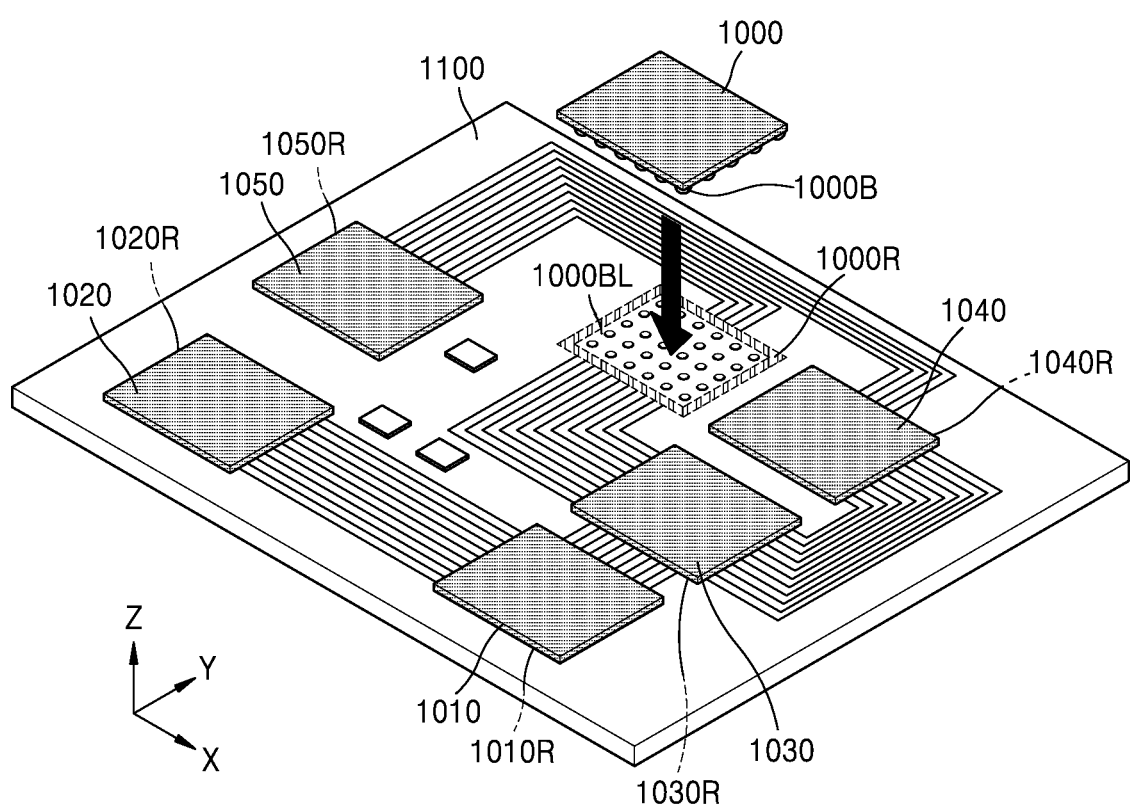
FIG. 1 is a schematic perspective view of a main board including a semiconductor package according to an embodiment of the inventive concept.

FIG. 1 is a schematic perspective view of a main board including a semiconductor package according to an embodiment of the inventive concept.

Referring to FIG. 1, a main board 1100 may include a variety of hardware components mounted on the top surface thereof.

The variety of hardware components included in the main board 1100 may be mounted in dedicated regions, respectively. For example, the main board 1100 may include a dedicated region 1000R for a storage device 1000, a dedicated region 1010R for a host 1010, a dedicated region 1020R for a memory 1020, a dedicated region 1030R for a chipset 1030, a dedicated region 1040R for a graphics processing device 1040, a dedicated region 1050R for a network module 1050, etc. Dedicated regions may be electrically connected to one another through various wires provided on the main board 1100.

As used herein, components described as being "electrically connected" are configured such that an electrical signal can be transferred from one component to the other (although such electrical signal may be attenuated in strength as it transferred and may be selectively transferred).

Figure 2:
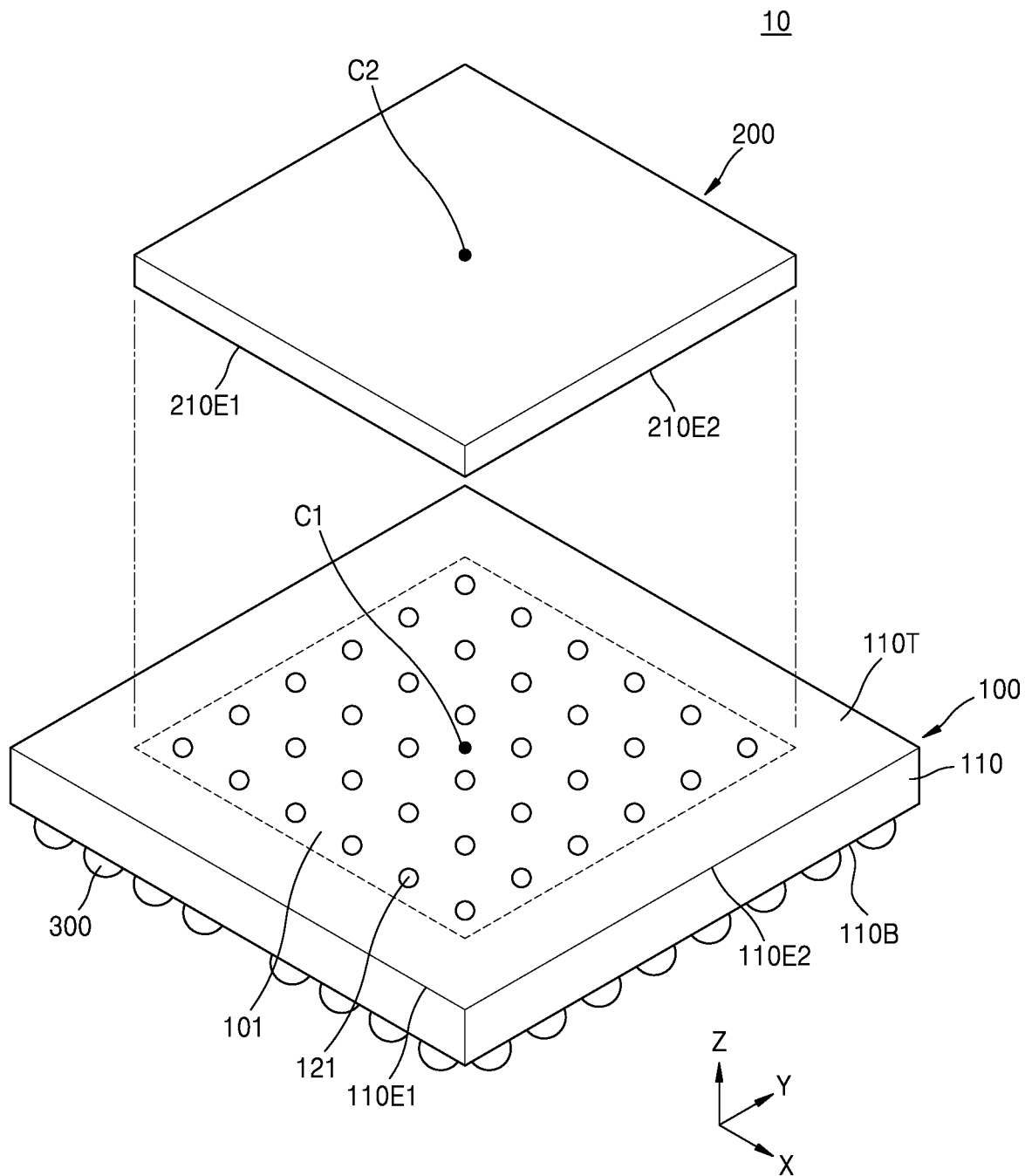
FIG. 2 is a perspective view of a semiconductor package including a printed circuit board according to an embodiment of the inventive concept.

In some embodiments, the storage device 1000, the host 1010, the memory 1020, the chipset 1030, the graphics processing device 1040, and/or the network module 1050 may be provided to a ball grid array (BGA)-type semiconductor package, for example, a semiconductor package 10 (refer to FIG. 2). For example, the storage device 1000 may include solder balls 1000B as external connection terminals, and the storage device 1000 may be mounted on the main board 1100, such that ball lands 1000BL located in the dedicated region 1000R and the solder balls 1000B are respectively coupled to and/or contact each other. The storage device 1000 may be mounted on the main board 1100 by using surface mounting technology.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A single storage device 1000 may be disposed on the main board 1100 or a plurality of storage devices 1000 may be disposed on the main board 1100. In some embodiments, storage devices 1000 may be mounted on different surfaces of the main board 1100. For example, one storage device 1000 may be mounted on the top surface of the main board 1100, and another storage device 1000 may be mounted on the bottom surface of the main board 1100.

The storage device 1000 may transmit program code to the host 1010 by using a side band protocol. In some embodiments, the side band protocol may further include a communication protocol like I2C, MCTP, SMBus, etc., which is provided, in addition to a communication protocol provided for normal operation. Detailed descriptions of the variety of hardware components will be given later.

FIG. 2 is a perspective view of a semiconductor package 10 including a printed circuit board according to an embodiment of the inventive concept.

Referring to FIG. 2, the semiconductor package 10 may include a printed circuit board 100 and a semiconductor chip 200.

The printed circuit board 100 may be a package substrate. The printed circuit board 100 may include a substrate base 110, upper connection pads 121 on a top surface 110T of the substrate base 110, and lower connection pads (not shown) on a bottom surface 110B of the substrate base 110.

Spatially relative terms, such as "beneath," "below," "lower," "above," "upper," "vertical," "horizontal" and the like, may be used herein for ease of description to describe positional relationships. It will be understood that the spatially relative terms encompass different orientations of the device in addition to the orientation depicted in the figures.

The substrate base 110 may form the overall shape of the printed circuit board 100 and may include or be formed of, for example, at least one material selected from among phenol resin, epoxy resin, and polyimide. An internal interconnection structure (e.g., a wiring pattern, a conductive via, etc.) for electrically connecting the upper connection pads 121 to the lower connection pads (not shown) may be provided inside the substrate base 110. The upper connection pads 121 may be electrically connected to and/or contact a conductive connection structure (not shown) on the bottom surface of the semiconductor chip 200, and the lower connection pads (not shown) may be electrically connected to and/or contact solder balls 300 which are external connection terminals.

The printed circuit board 100 may include a mounting region 101, in which the semiconductor chip 200 is mounted. The mounting region 101 is a region in which the semiconductor chip 200 is mounted, and the mounting region 101 and the semiconductor chip 200 may substantially overlap each other in a vertical direction (Z direction). Since the mounting region 101 overlaps the semiconductor chip 200 in the vertical direction (Z direction), the mounting region 101 may have a shape and a size identical to those of the semiconductor chip 200. For example, the mounting region 101 of the printed circuit board 100 may be defined by a vertically overlapping region between the semiconductor chip 200 and the printed circuit board 100.

Furthermore, when a first horizontal direction (X direction) is defined as a direction parallel to a first edge 210E1 of the semiconductor chip 200 and a second horizontal direction (Y direction) is defined as a direction parallel to a second edge 210E2 of the semiconductor chip 200, a center point C1 of the mounting region 101 and a center point C2 of the semiconductor chip 200 may coincide with each other on a plane parallel to the first horizontal direction (X direction) and the second horizontal direction (Y direction), e.g., in a plan view. For example, the center point C1 of the mounting region 101 and the center point C2 of the semiconductor chip 200 may vertically overlap.

Also, the width of the semiconductor chip 200 in the first horizontal direction (X direction) may be substantially the same as the width of the mounting region 101 in the first horizontal direction (X direction), and the width of the semiconductor chip 200 in the second horizontal direction (Y direction) may be substantially the same as the width of the mounting region 101 in the second horizontal direction (Y direction).

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

In some embodiments, the semiconductor chip 200 may be mounted in the mounting region 101 of the printed circuit board 100 by using a flip chip method. For example, the semiconductor chip 200 may be electrically connected to the upper connection pads 121 of the printed circuit board 100 through a conductive connection structure (not shown), e.g., solder bumps, but the inventive concept is not limited thereto. In other embodiments, the semiconductor chip 200 may be mounted in the mounting region 101 of the printed circuit board 100 through a bonding wire.

The semiconductor chip 200 may be a logic chip or a memory chip. The memory chip may include or may be, for example, a volatile memory chip like dynamic random access memory (DRAM) or static random access memory (SRAM) or a non-volatile memory chip like phase-change RAM (PRAM), magnetoresistive RAM (MRAM), ferroelectric RAM (FeRAM), or resistive RAM (RRAM). Also, the logic chip may include or may be, for example, a microprocessor, an analog device, a digital signal processor, or an application processor.

Although the semiconductor package 10 is illustrated as including one semiconductor chip 200 in the drawing, the semiconductor package 10 may include a plurality of semiconductor chips 200. In some embodiments, the semiconductor chip 200 may be a chip stack in which a plurality of semiconductor chips 200 are vertically stacked. For example, the semiconductor chip 200 may be a high bandwidth memory (HBM).

A center point C1 of the printed circuit board 100 may substantially coincide with the center point C1 of the mounting region 101 and/or the center point C2 of the semiconductor chip 200 on a plane parallel to the first direction (X direction) and the second direction (Y direction). In this case, when an edge of the printed circuit board 100, close to the first edge 210E1 of the semiconductor chip 200, is defined as a first edge 110E1 of the printed circuit board 100 and an edge of the printed circuit board 100, opposite to the first edge 110E1, is defined as a second edge 110E2 of the printed circuit board 100, the center point C1 of the printed circuit board 100 may be located at a point substantially at the same distance from the first edge 110E1 and the second edge 110E2 of the printed circuit board 100.

As such, the center point C1 of the printed circuit board 100 may play an important role in the configuration of the semiconductor package 10. Therefore, to provide accurate information regarding the center point C1 of the printed circuit board 100, an identification mark like an alignment mark AM1 (refer to FIG. 3) is demanded. Detailed descriptions thereof will be given later.

Although not shown, an underfill material layer may be provided between the printed circuit board 100 and the semiconductor chip 200. For example, the underfill material layer filling the space between the printed circuit board 100 and the semiconductor chip 200 may be formed through an underfill process. The underfill material layer may be filled between the printed circuit board 100 and the semiconductor chip 200 and surround the conductive connection structure (not shown) provided between the printed circuit board 100 and the semiconductor chip 200.

Figure 3:
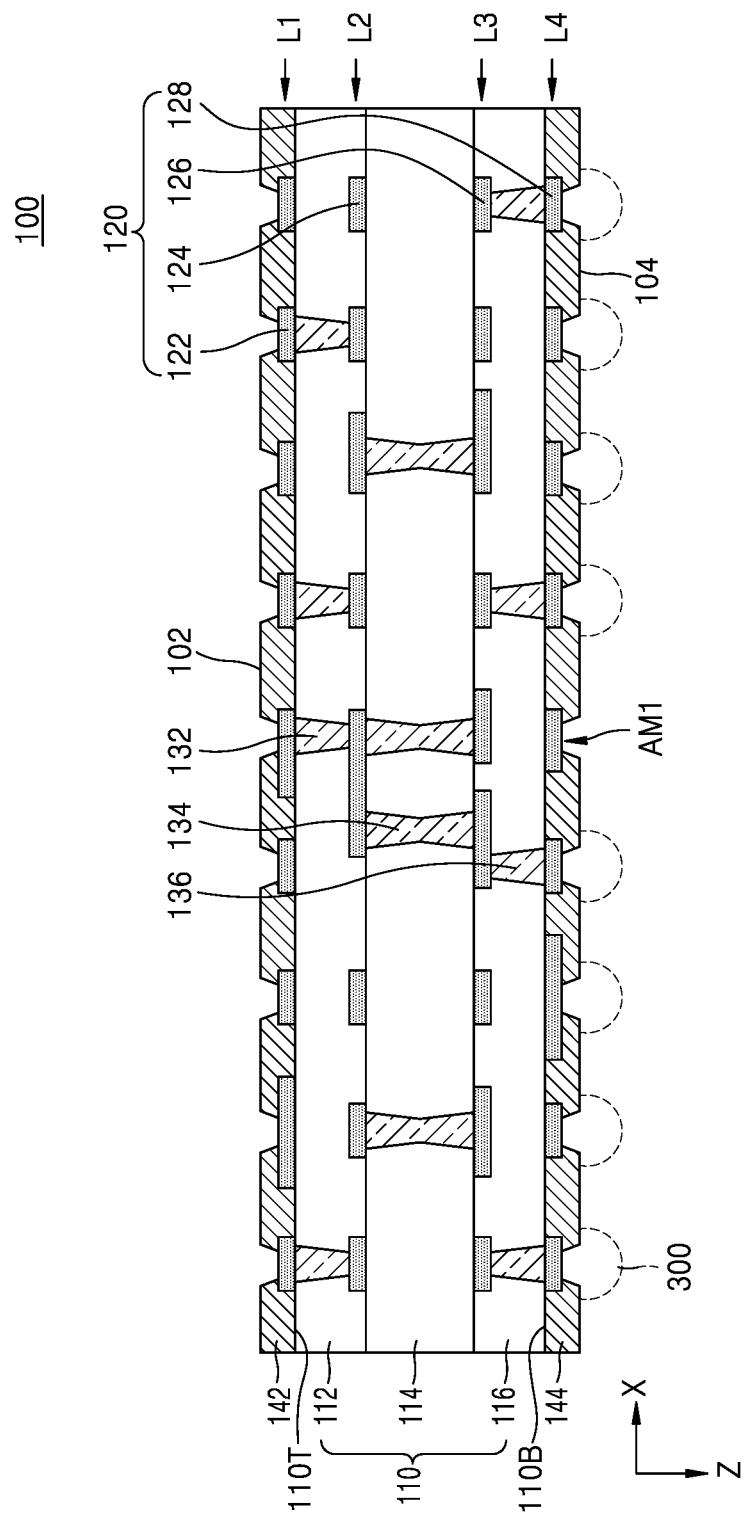
FIG. 3 is a cross-sectional view of a printed circuit board according to an embodiment of the inventive concept.

FIG. 3 is a cross-sectional view of a printed circuit board according to an embodiment of the inventive concept.

Referring to FIG. 3, a printed circuit board 100 may include first to fourth wiring layers L1, L2, L3, and L4 having the substrate base 110 and wiring patterns 120.

The substrate base 110 may be formed by stacking a plurality of base layers 112, 114, and 116. The first to fourth wiring layers L1, L2, L3, and L4 may be arranged/positioned on top surfaces and bottom surfaces of the base layers, for example, first, second, and third base layers 112, 114, and 116. However, the number of base layers and the number of wiring layers in the substrate base 110 are not limited thereto.

When the substrate base 110 is formed by stacking the first base layer 112, the second base layer 114, and the third base layer 116, the first to fourth wiring layers L1, L2, L3, and L4 may include a first wiring layer L1 disposed on the top surface of the first base layer 112, a second wiring layer L2 disposed between the bottom surface of the first base layer 112 and the top surface of the second base layer 114, a third wiring layer L3 disposed between the bottom surface of the second base layer 114 and the top surface of the third base layer 116, and a fourth wiring layer L4 disposed on the bottom surface of the third base layer 116.

The first to fourth wiring layers L1, L2, L3, and L4 may have the wiring patterns 120. For example, the first wiring layer L1 may have a first wiring pattern 122, the second wiring layer L2 may have a second wiring pattern 124, the third wiring layer L3 may have a third wiring pattern 126, and the fourth wiring layer L4 may have a fourth wiring pattern 128.

The first to fourth wiring patterns 122, 124, 126, and 128 may each include or be formed of a conductive material. In some embodiments, the first to fourth wiring patterns 122, 124, 126, and 128 may each include or be formed of a metal.

In some embodiments, the first to fourth wiring patterns 122, 124, 126, and 128 of the first to fourth wiring layers L1, L2, L3, and L4 may include or be formed of substantially the same metal material, e.g., the same metal. The first to fourth wiring patterns 122, 124, 126, and 128 may be formed through a plating process. For example, the first to fourth wiring patterns 122, 124, 126, and 128 may include or be formed of copper (Cu), nickel (Ni), and/or gold (Au), but are not limited thereto.

A plurality of conductive vias 132, 134, and 136 electrically connecting between the first to fourth wiring patterns 122, 124, 126, and 128 may be formed in the substrate base 110. In some embodiments, the conductive vias 132, 134, and 136 may include or be formed of copper (Cu), nickel (Ni), and/or beryllium copper. The conductive vias 132, 134, and 136 may include a first conductive via 132 penetrating through the first base layer 112, a second conductive via 134 penetrating through the second base layer 114, and a third conductive via 136 penetrating through the third base layer 116.

A top surface solder resist layer 142 covering or vertically overlapping at least a portion of the first wiring pattern 122 may be formed on the top surface of the substrate base 110. A bottom surface solder resist layer 144 covering or vertically overlapping at least a portion of the fourth wiring pattern 128 may be formed on the bottom surface of the substrate base 110. A portion of the first wiring pattern 122 and a portion of the fourth wiring pattern 128 that are exposed without being covered by the top surface solder resist layer 142 and the bottom surface solder resist layer 144 may be upper connection pads and lower connection pads of the printed circuit board 100, respectively. An organic solderability preservative (OSP) (not shown) may be included/formed on the top surface of each of the upper connection pads and the lower connection pads.

The semiconductor chip 200 (refer to FIG. 2) may be mounted on a top surface 102 of the printed circuit board 100. For example, the top surface 102 of the printed circuit board 100 may be a chip mounting surface. The solder balls 300, which are external connection terminals, may be attached to a bottom surface 104 of the printed circuit board 100. For example, the bottom surface 104 of the printed circuit board 100 may be a connection terminal attaching surface. For example, the bottom surface 104 of the printed circuit board 100 may have a rectangular shape. The semiconductor chip 200 (refer to FIG. 2) may be electrically connected to the first wiring pattern 122, which is an upper connection pad. Also, the solder balls 300 may be electrically connected to the fourth wiring pattern 128, which is a lower connection pad. A mold layer (not shown) covering at least a portion of the top surface 102 of the printed circuit board 100 and the semiconductor chip 200 may be formed on the top surface 102 of the printed circuit board 100.

In the printed circuit board 100 according to the inventive concept, the alignment mark AM1 may be located at the fourth wiring layer L4, which is the lowermost layer of the first to fourth wiring layers L1, L2, L3, and L4. For example, as a portion of the fourth wiring pattern 128 that is exposed without being covered by the bottom surface solder resist layer 144, the alignment mark AM1 may be formed at the same level in the vertical direction (Z direction) as that of the lower connection pad. An OSP (not shown) may be included/formed on the top surface of the alignment mark AM1, like the lower connection pad. For example, the top surface of the alignment mark AM1 may comprise or be formed of an OSP.

Figure 4:
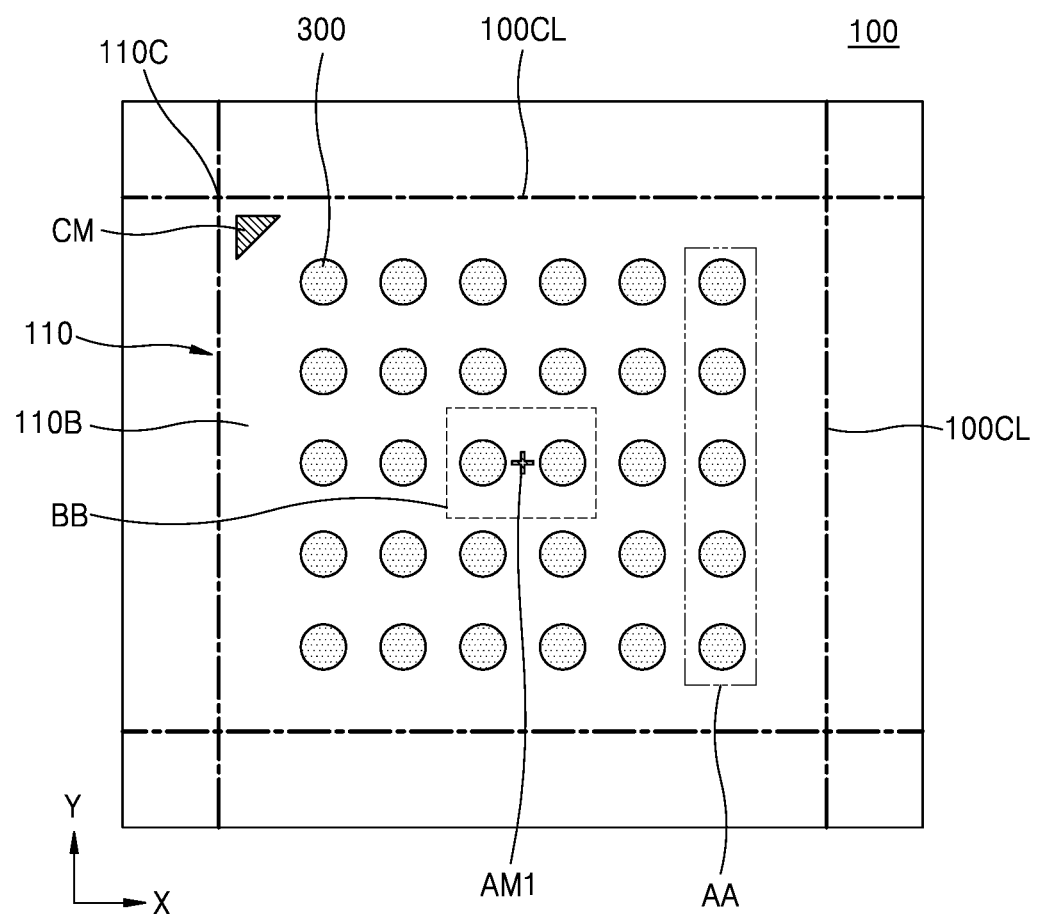
FIG. 4 is a bottom view of a printed circuit board according to an embodiment of the inventive concept.
Figure 5:
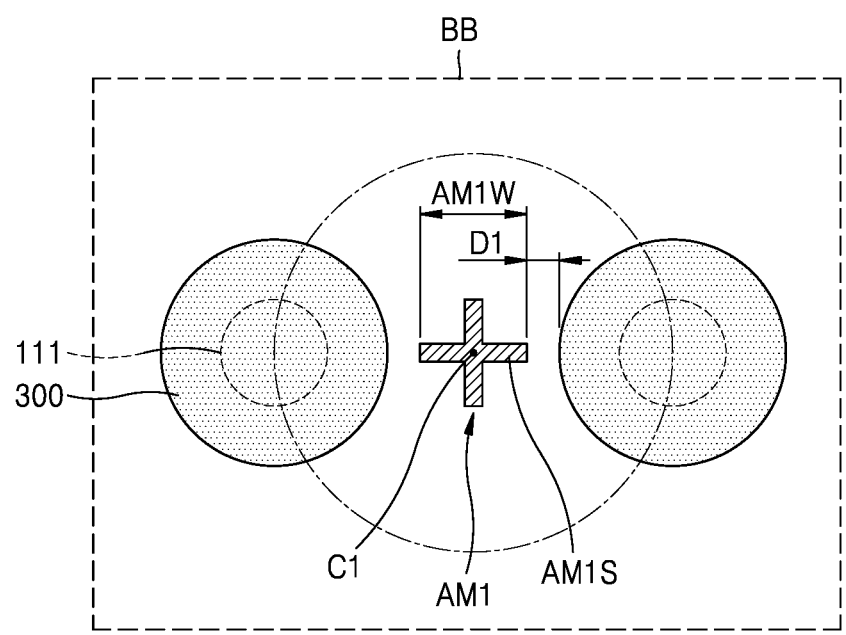
FIG. 5 is a partially enlarged view of a portion BB of FIG. 4.

FIG. 4 is a bottom view of a printed circuit board according to an embodiment of the inventive concept, and FIG. 5 is a partially enlarged view of a portion BB of FIG. 4.

Referring to FIGS. 4 and 5 together, the printed circuit board 100 including a cutting position identification mark CM and the alignment mark AM1 is shown.

The printed circuit board 100 may include a plurality of ball lands 111 arranged in columns on the bottom surface 110B of the substrate base 110, the cutting position identification mark CM disposed at one corner 110C of the bottom surface 110B of the substrate base 110, and the alignment mark AM1 disposed to be exposed to the outside at the center point C1 of the bottom surface 110B of the substrate base 110.

The ball lands 111 are a portion of the fourth wiring pattern 128 (refer to FIG. 3) and may be lower connection pads to which the solder balls 300 are attached. The top surface of the ball lands 111 and a top surface AM1S of the alignment mark AM1 may be positioned at substantially the same vertical level. Also, the ball lands 111 and the alignment mark AM1 may include or be formed of the same material.

The alignment mark AM1 may be disposed at the center point C1 of the bottom surface 110B of the substrate base 110 and may be at least partially surrounded by the ball lands 111. As shown in the drawings, the ball lands 111 may be arranged on both sides of the alignment mark AM1 in the first horizontal direction (X direction), but the inventive concept is not limited thereto. Depending on the arrangement of the ball lands 111 according to the design of the printed circuit board 100, the arrangement relationship with respect to the alignment mark AM1 may vary.

In some embodiments, a top surface of the alignment mark AM1 may be covered by an OSP. In other embodiments, the alignment mark AM1 may include a light-reflective conductive metal. This is because both the ball lands 111 and the alignment marks AM1 are portions of the same fourth wiring pattern 128 (refer to FIG. 3). For example, the alignment marks AM1 may be formed of the same layer and the same material as the ones of the fourth wiring pattern 128.

A maximum width AM1W of the alignment mark AM1 may be from about 30 μm to about 300 μm. The alignment mark AM1 is a means for determining the center point C1 in a test process S10 (refer to FIG. 6) and may have different sizes depending on the design and the size of the printed circuit board 100. Also, the maximum width AM1W of the alignment mark AM1 may be determined considering the attachment margin of the solder balls 300 together.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Considering the attachment margin of the solder balls 300, the separation distance D1 between the solder balls 300 attached to the ball lands 111 and the alignment mark AM1 may be about 10 μm or greater. For example, the closest distance between the solder balls 300 attached to the ball lands 111 and the alignment mark AM1 may be about 10 μm or greater. When the alignment mark AM1 is located closer to the solder balls 300, some of the solder balls 300 may extend over the region of the alignment mark AM1, thereby causing unwanted defects (e.g., short circuits).

The cutting position identification mark CM may have a triangular shape. The alignment mark AM1 may have a cross-like shape, e.g., cross shape. However, it is merely an example. For example, the cutting position identification mark CM may have a circular shape, and the alignment mark AM1 may have any of various identifiable shapes like an asterisk shape, a rectangular shape, a polygonal shape, etc.

The alignment mark AM1 may be used alone for the purpose of checking the center point C1 of a cut printed circuit board 100. Alternatively, the alignment mark AM1 may be used to check the center point C1 of the cut printed circuit board 100 together with the cutting position identification mark CM.

After cutting the printed circuit board 100 along a cutting line 100CL, to check the quality of each semiconductor package 10 (refer to FIG. 2), the test process S10 (refer to FIG. 6) of checking the unit size of the printed circuit board 100 and whether the printed circuit board 100 is cut to be consistent with a desired/target design is performed. In such a test process, a test device determines a defect (e.g. due to improper cutting) by recognizing the first edge 110E1 (refer to FIG. 2) and the second edge 110E2 (refer to FIG. 2) of the printed circuit board 100 along the cutting line 100CL (e.g., cut edges) of the printed circuit board 100 and calculating a difference between distances to the center point C1 of the printed circuit board 100.

In a conventional test process for the printed circuit board 100, since accurate alignment is needed to calculate the difference between distances, the center point of the printed circuit board 100 is recognized based on an alignment portion AA of the solder balls 300. However, when some of the solder balls 300 are not attached or improperly attached at the alignment portion AA of the solder balls 300 or quality defects occur in some of the solder balls 300, there is a possibility that an error occurs in checking of the center point of the printed circuit board 100. For example, although cutting is performed correctly, the cutting of the printed circuit board 100 may be determined to be defective due to an adhesion defect within the margin range of the solder balls 300. For example, even though the adhesion of the solder balls 300 is within the margin range, the cutting of the printed circuit board 100 may be determined to be defective.

Therefore, rather than the relatively inaccurate method of checking the center point of the printed circuit board 100 by using the alignment portion AA of the solder balls 300, an improved method capable of more accurately checking the center point of the printed circuit board 100 is demanded. For example, an improved method capable of fundamentally addressing erroneous detection of cutting due to poor adhesion of the solder balls 300 is demanded.

As an improved method to address the problem, according to the printed circuit board 100 according to the inventive concept, an alignment mark AM1 may be designed/positioned at the center point C1 of the printed circuit board 100, and the center point C1 of the printed circuit board 100 may be accurately detected by using the alignment mark AM1. Also, the printed circuit board 100 may be designed without an additional process, because the alignment mark AM1 may be formed in the same process as a process of fabricating the ball lands 111.

Ultimately, according to the printed circuit board 100 according to the inventive concept, defects that may occur during a process of cutting the printed circuit board 100 may be accurately detected without an error by using the alignment mark AM1 located at the center point C1 of the printed circuit board 100, and high product reliability and high production efficiency may be provided.

Figure 6:
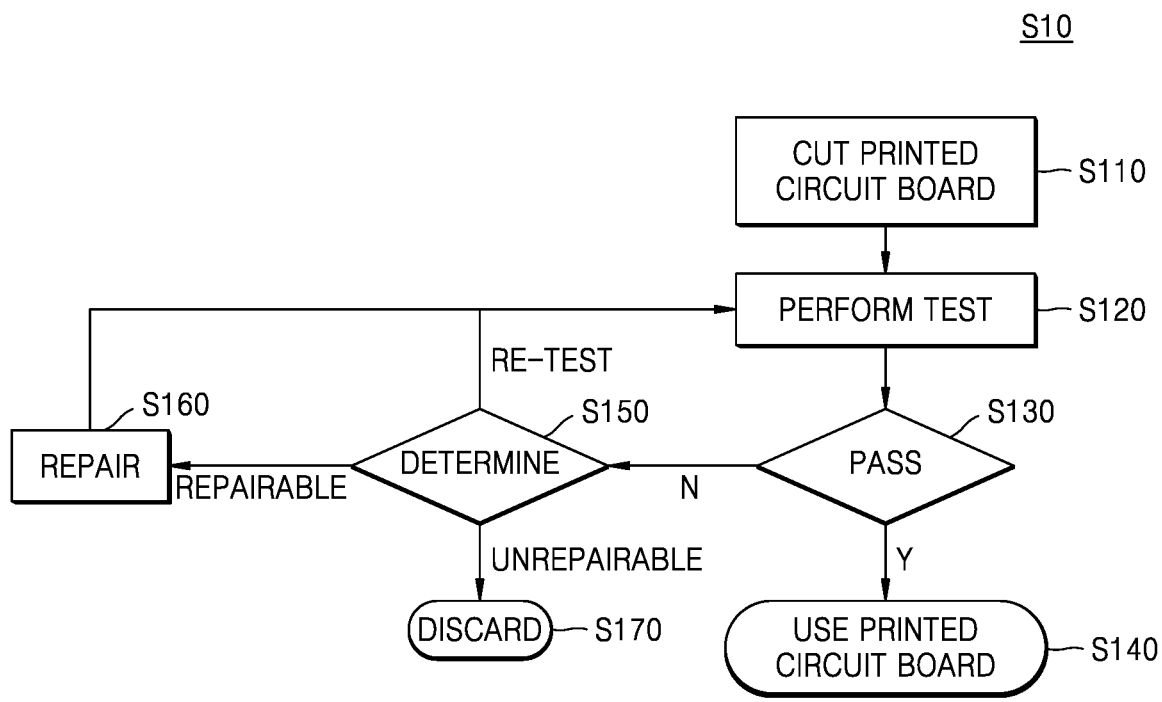
FIG. 6 is a flowchart showing a test process for a printed circuit board according to an embodiment of the inventive concept.

FIG. 6 is a flowchart showing a test process for a printed circuit board according to an embodiment of the inventive concept.

Referring to FIG. 6, the test process S10 for a printed circuit board may include first to seventh operations S110 to S170 as described below.

Where a certain embodiment may be implemented otherwise, particular operations may be performed in an order different from that described below. For example, two successively described operations may be performed substantially simultaneously or may be performed in an order opposite to the order described below.

First, first operation S110 of cutting a printed circuit board may be performed. To describe a process of manufacturing a printed circuit board in detail, a large printed circuit board module is prepared. Next, a plurality of semiconductor chips are mounted in a plurality of mounting regions on the top surface of the large printed circuit board module, and a molding layer is formed to cover the semiconductor chips. Next, a plurality of solder balls are attached to a plurality of ball lands located on the bottom surface of the large printed circuit board module. The large printed circuit board module, on which the semiconductor chips are mounted and the solder balls are attached, is separated into unit printed circuit boards having a pre-set size by cutting the large printed circuit board module along a cutting line.

Second operation S120 of performing a test on a cut printed circuit board may be performed. The test on the cut printed circuit board may include, for example, checking an alignment mark according to the inventive concept by using an image processing device to determine whether a cut surface is accurately cut. For example, the testing of the cut printed circuit board may determine whether the cutting is performed as designed.

To perform a test on the cut printed circuit board, each unit printed circuit board is analyzed by using an image processing device. In some embodiments, tests on a plurality of unit printed circuit boards may be simultaneously performed. A test result for each unit printed circuit board may be transmitted to a test server.

Third operation S130 of checking whether a test result is pass may be performed. A printed circuit board that passed the test (Y) is used as a semiconductor package in fourth operation S140 and the test process thereon is ended. A printed circuit board that passed the test (Y) may be used as a semiconductor package and supplied to the market. On the other hand, a printed circuit board that failed the test (N) proceeds to fifth operation S150 in which a determination process is performed. It is determined whether to perform a re-test or repair on the printed circuit board that failed the test (N).

The determination may be made by analyzing a test result. For example, when a defect of a cut surface of the cut printed circuit board is suspected or a test result is not clear, a re-test may be performed.

When it is determined to be repairable, sixth operation S160 of repairing the corresponding unit printed circuit board may be performed, and a re-test may be performed thereon. On the other hand, a unit printed circuit board that is determined to be unrepairable or a unit printed circuit board that also failed a re-test is discarded in seventh operation S170.

FIGS. 7 to 12 are bottom views of printed circuit boards according to embodiments of the inventive concept.

Most of components constituting printed circuit boards 100A, 100B, 100C, 100D, 100E, and 100F described below and materials constituting the components thereof are substantially the same as or similar to those described with reference to FIGS. 4 and 5 above. Therefore, for convenience of explanation, descriptions below will focus on differences from the printed circuit board 100 described above.

Figure 7:
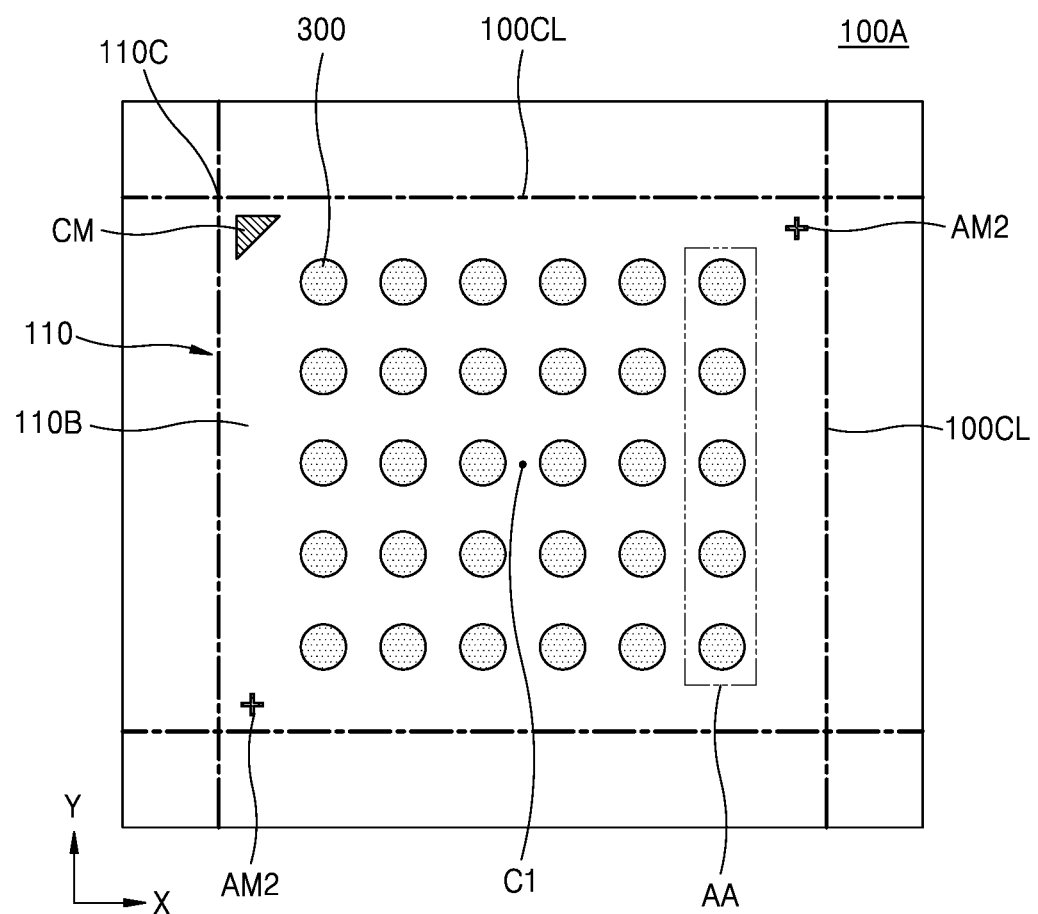
FIGS. 7 to 12 are bottom views of printed circuit boards according to embodiments of the inventive concept.

Referring to FIG. 7, a printed circuit board 100A including a cutting position identification mark CM and a plurality of alignment marks AM2 is shown.

The printed circuit board 100A according to the present embodiment may include a plurality of ball lands (not shown) arranged in columns on the bottom surface 110B of the substrate base 110 and the cutting position identification mark CM and the alignment marks AM2 arranged/positioned at corners 110C of the bottom surface 110B of the substrate base 110.

For example, the alignment marks (e.g., two alignment marks) AM2 may be located respectively at two corners 110C of the bottom surface 110B of the substrate base 110, where the cutting position identification mark CM is not disposed. Also, the alignment marks AM2 may be arranged/disposed to face each other diagonally on the bottom surface 110B of the substrate base 110. For example, the bottom surface 110B of the substrate base 110 may have a rectangular shape, e.g., in a plan view, and two alignment marks AM2 may be disposed at two respective corners of the rectangular surface of the substrate base 110 facing each other diagonally.

Both the alignment marks AM2 may be used to check the center point C1 of the printed circuit board 100A after the printed circuit board 100A is cut. Alternatively, the alignment marks AM2 may be used to check the center point C1 of the printed circuit board 100A together with the cutting position identification mark CM after the printed circuit board 100A is cut. In certain embodiments, two or more neighboring alignment marks together may be used to check a center point of a cut printed circuit board.

Figure 8:
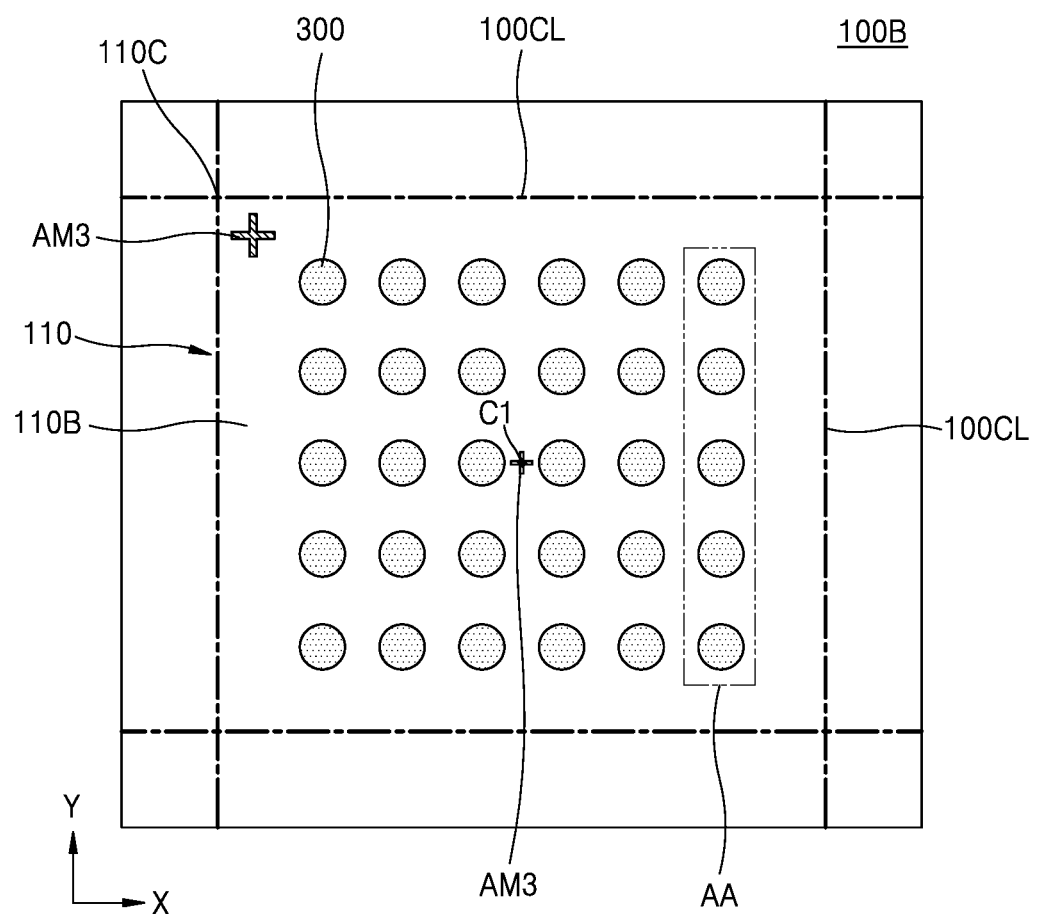

Referring to FIG. 8, a printed circuit board 100B including a cutting position identification mark CM and a plurality of alignment marks AM3 is shown.

The printed circuit board 100B according to the present embodiment may include a plurality of ball lands (not shown) arranged in columns on the bottom surface 110B of the substrate base 110 and the alignment marks AM3 arranged/positioned at the center point C1 and the corner 110C of the bottom surface 110B of the substrate base 110.

For example, the alignment marks AM3 may be located at one corner 110C of the bottom surface 110B of the substrate base 110 and the center point C1 of the bottom surface 110B of the substrate base 110, respectively. The alignment marks AM3 arranged/positioned at different positions may have different sizes, but the inventive concept is not limited thereto.

Both the alignment marks AM3 may be used to check the center point C1 of the printed circuit board 100B after the printed circuit board 100B is cut. Alternatively, the alignment marks AM3 may be used for the same purpose as the cutting position identification mark CM (refer to FIG. 7).

Figure 9:
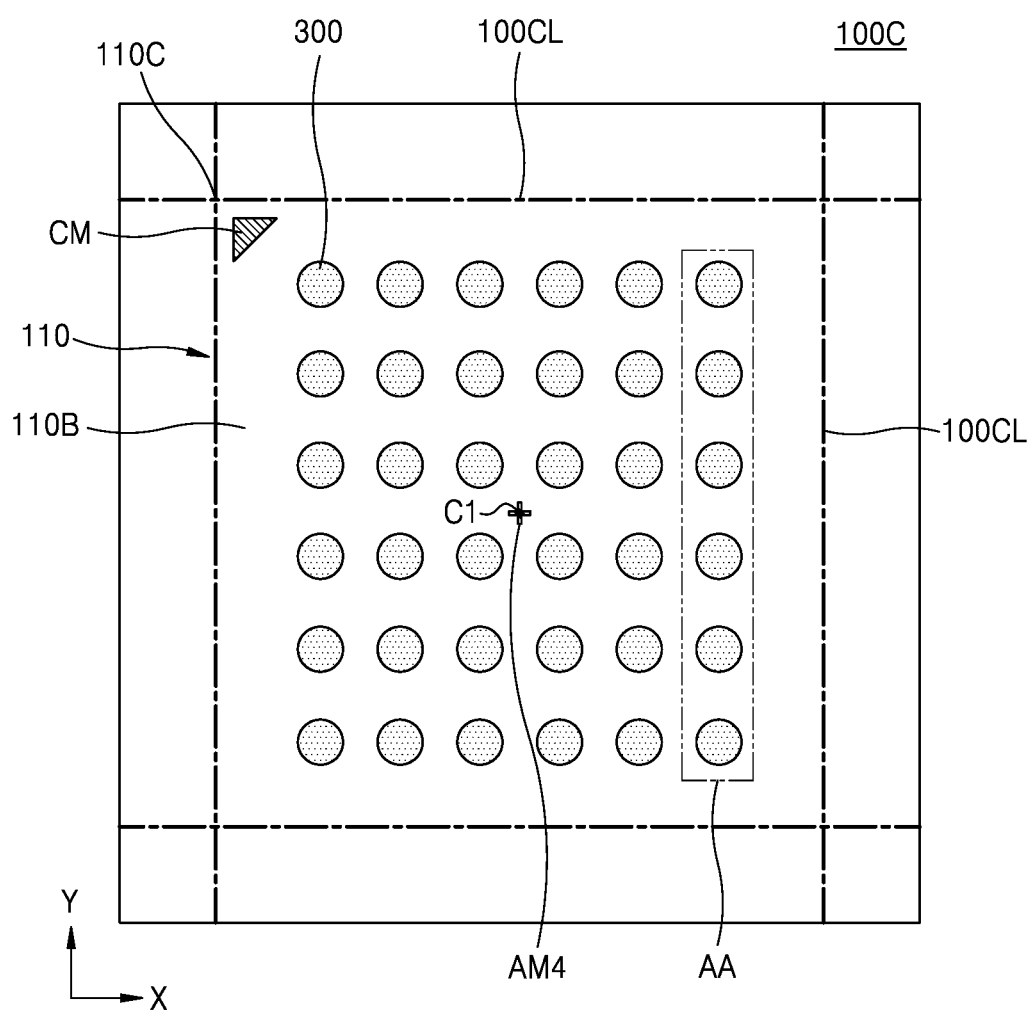

Referring to FIG. 9, a printed circuit board 100C including a cutting position identification mark CM and an alignment mark AM4 is shown.

The printed circuit board 100C according to the present embodiment may include the solder balls 300 arranged in columns on the bottom surface 110B of the substrate base 110 and the alignment mark AM4 arranged/positioned at the center point C1 of the bottom surface 110B of the substrate base 110.

For example, the alignment mark AM4 may be disposed at the center point C1 of the bottom surface 110B of the substrate base 110 and may be disposed in a cross-like shape, e.g., a cross shape, in the space between the solder balls 300. Also, the alignment mark AM4 may be disposed while maintaining the separation distance D1 (refer to FIG. 5) from the solder balls 300. Depending on the arrangement of the solder balls 300 according to the design of the printed circuit board 100C, the arrangement relationship with respect to the alignment mark AM4 may vary.

Figure 10:
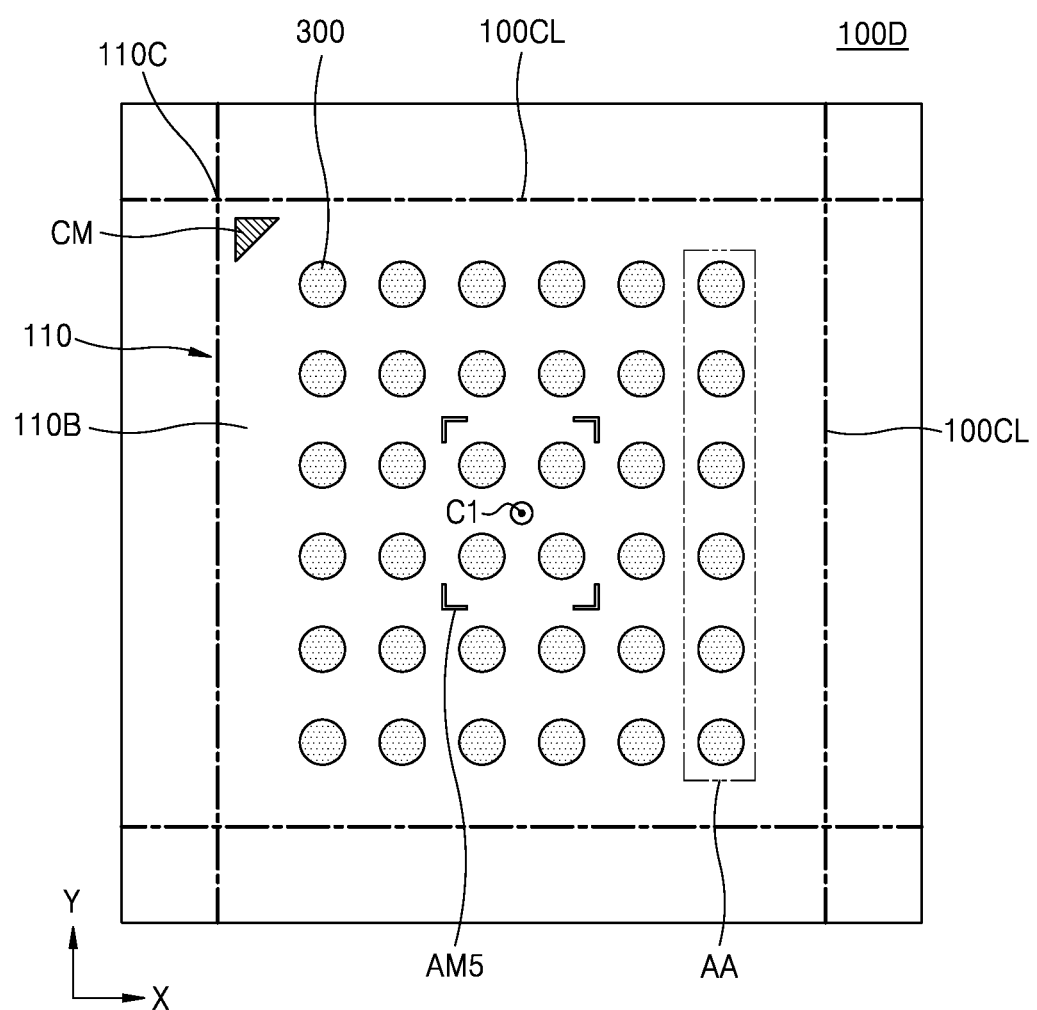

Referring to FIG. 10, a printed circuit board 100D including a cutting position identification mark CM and an alignment mark AM5 is shown.

The printed circuit board 100D according to the present embodiment may include the solder balls 300 arranged in columns on the bottom surface 110B of the substrate base 110 and the alignment mark AM5 arranged/positioned at the center point C1 of the bottom surface 110B of the substrate base 110.

For example, the alignment mark AM5 may have a circular portion disposed at the center point C1 of the bottom surface 110B of the substrate base 110 and a rectangular bracket-like portion outside four solder balls 300 surrounding the center point C1. Depending on the arrangement of the solder balls 300 according to the design of the printed circuit board 100D, the arrangement relationship with respect to the alignment mark AM5 may vary.

Figure 11:
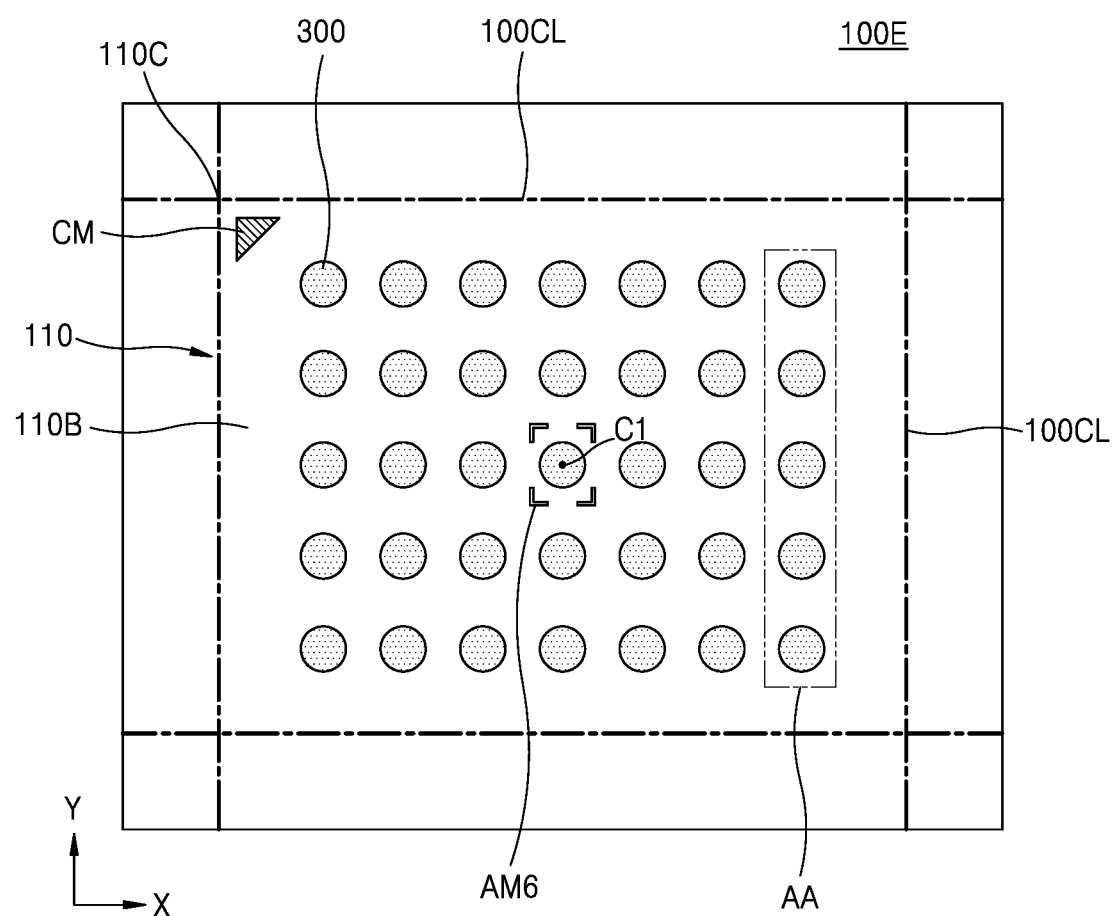

Referring to FIG. 11, a printed circuit board 100E including the cutting position identification mark CM and an alignment mark AM6 is shown.

The printed circuit board 100E according to the present embodiment may include the solder balls 300 arranged in columns on the bottom surface 110B of the substrate base 110 and the alignment mark AM6 arranged/positioned at the center point C1 of the bottom surface 110B of the substrate base 110.

For example, the alignment mark AM6 may have a rectangular bracket-like shape outside one solder ball 300 disposed at the center point C1 of the printed circuit board 100. Depending on the arrangement of the solder balls 300 according to the design of the printed circuit board 100E, the arrangement relationship with respect to the alignment mark AM6 may vary.

Figure 12:
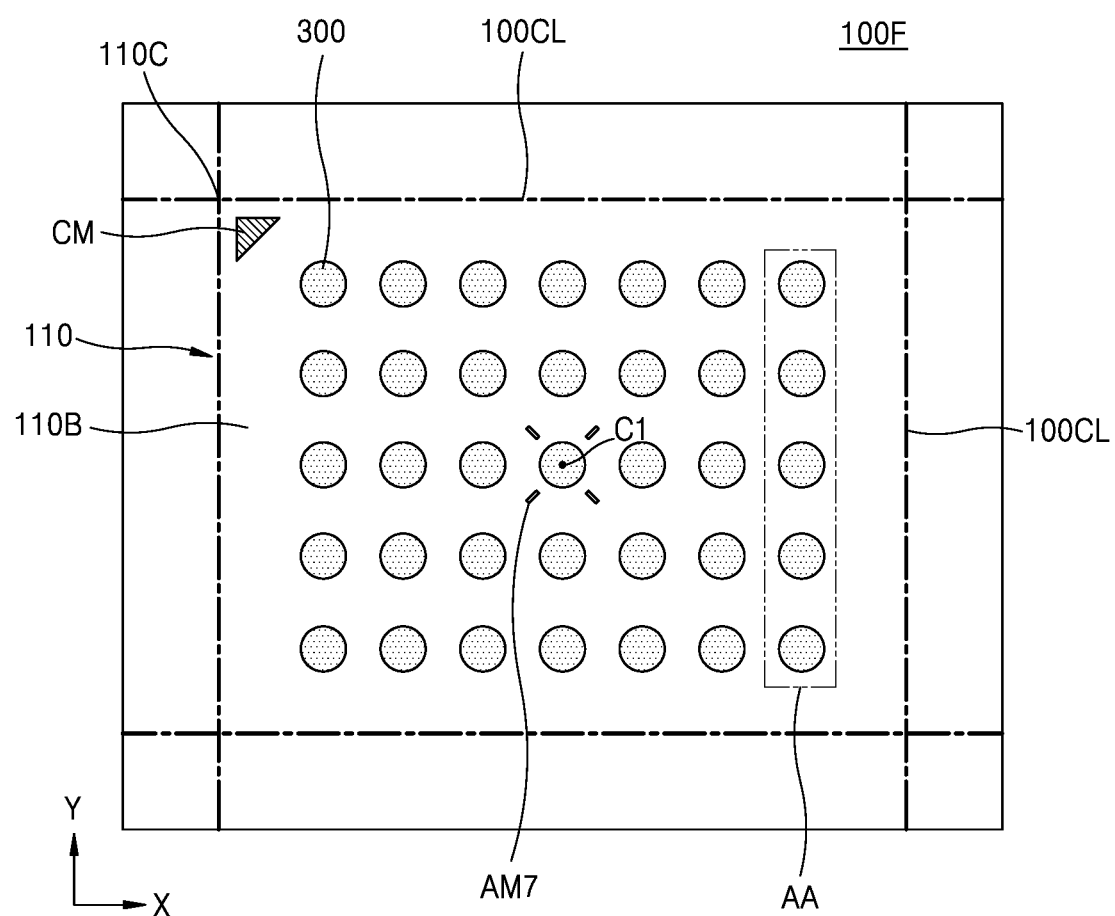

Referring to FIG. 12, a printed circuit board 100F including the cutting position identification mark CM and an alignment mark AM7 is shown.

The printed circuit board 100F according to the present embodiment may include the solder balls 300 arranged in columns on the bottom surface 110B of the substrate base 110 and the alignment mark AM7 arranged/positioned at the center point C1 of the bottom surface 110B of the substrate base 110.

For example, the alignment mark AM7 may have a radial shape outside/surrounding one solder ball 300 disposed at the center point C1. Depending on the arrangement of the solder balls 300 according to the design of the printed circuit board 100F, the arrangement relationship with respect to the alignment mark AM7 may vary.

Figure 13:
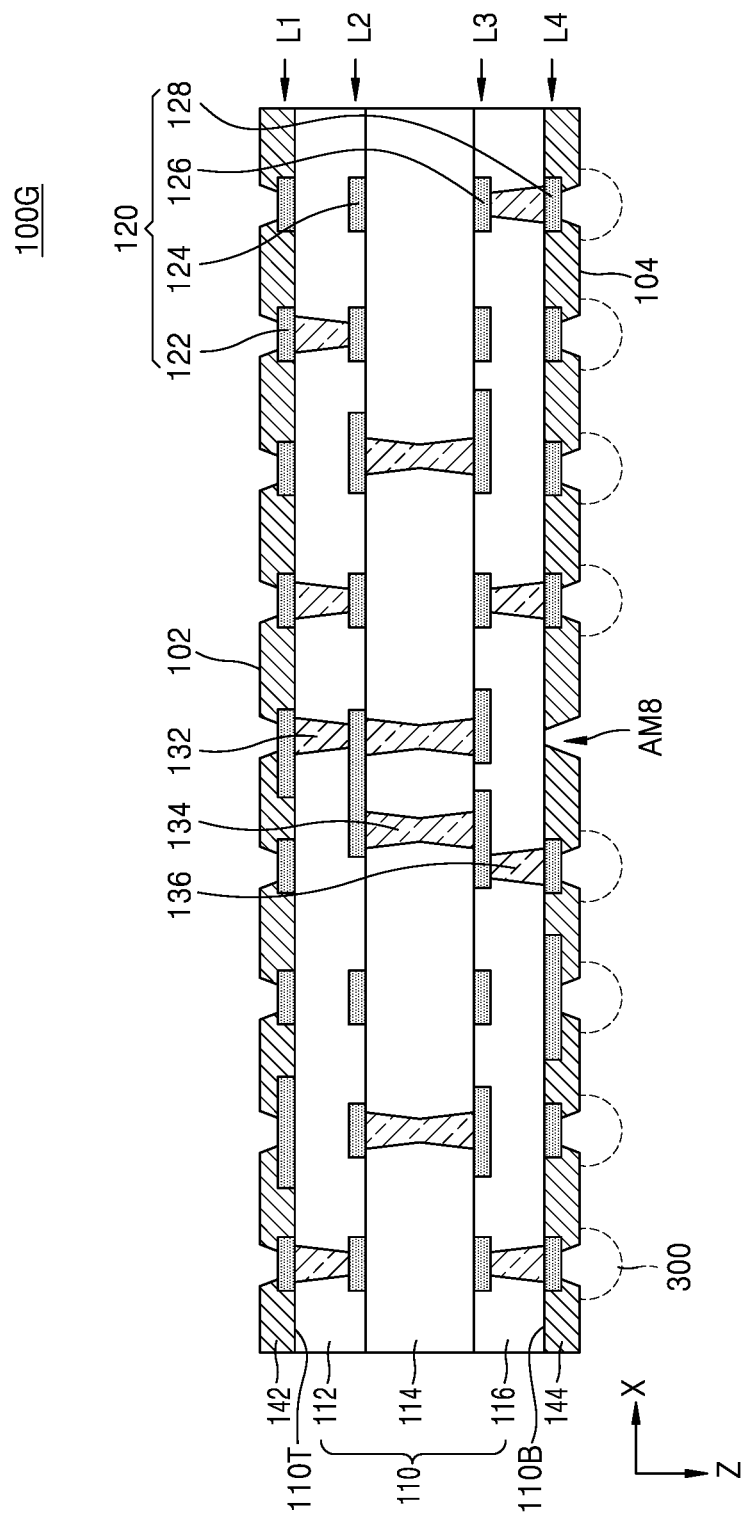
FIGS. 13 and 14 are cross-sectional views of printed circuit boards according to embodiments of the inventive concept.
Figure 14:
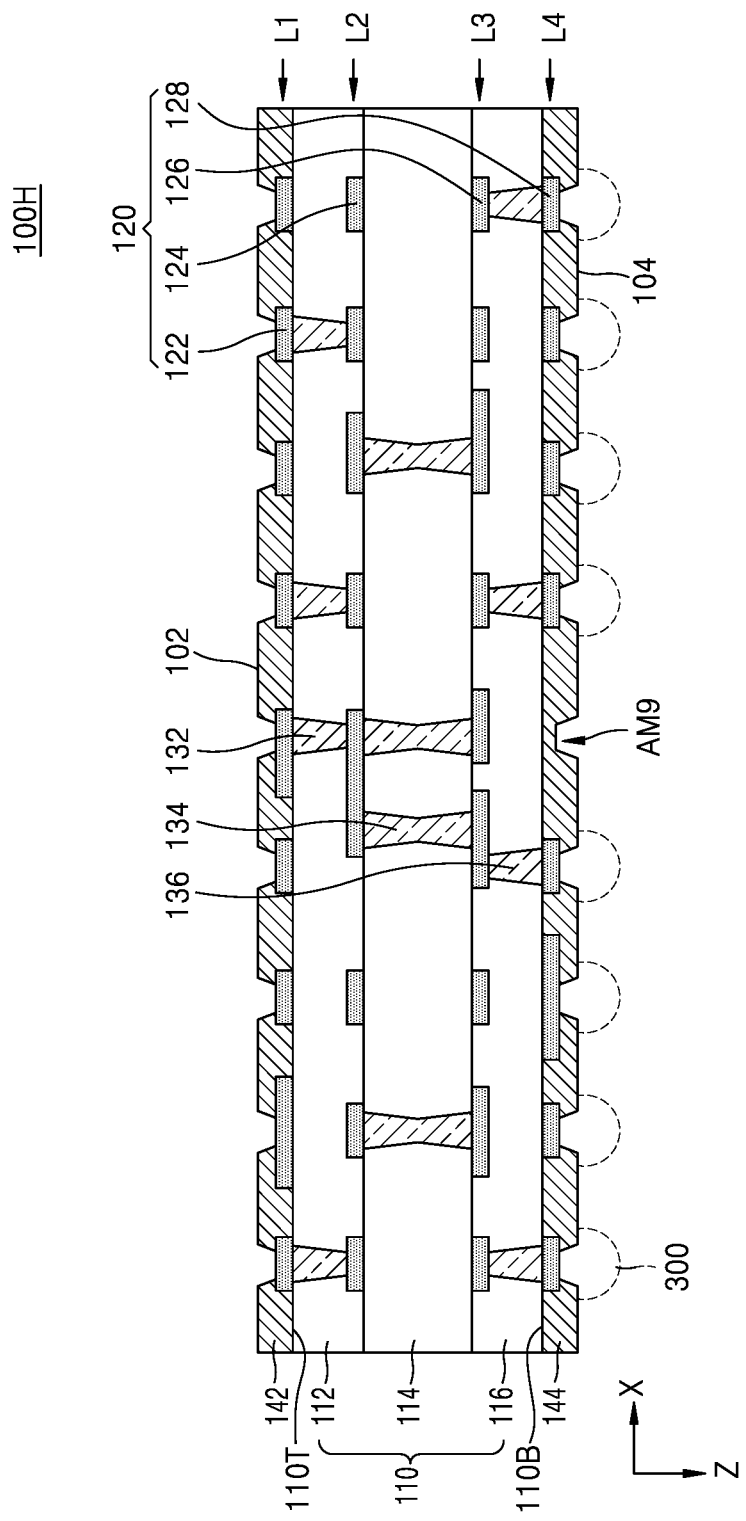

FIGS. 13 and 14 are cross-sectional views of printed circuit boards according to embodiments of the inventive concept.

Most of components constituting printed circuit boards 100G and 100H described below and materials constituting the components thereof are substantially the same as or similar to those described with reference to FIG. 3 above. Therefore, for convenience of explanation, descriptions below will focus on differences from the printed circuit board 100 described above.

Referring to FIG. 13, the printed circuit board 100G may include the substrate base 110, the wiring patterns 120, and an alignment mark AM8.

In the printed circuit board 100G of the present embodiment, the alignment mark AM8 may be located on the bottom surface of the third base layer 116, which is the bottommost layer of the first to third base layers 112, 114, and 116. For example, as a portion of the third base layer 116 that is exposed without being covered by the bottom surface solder resist layer 144, the alignment mark AM8 may be formed at the same level in the vertical direction (Z direction) as that of the bottom surface of the third base layer 116.

Referring to FIG. 14, the printed circuit board 100H may include the substrate base 110, the wiring patterns 120, and an alignment mark AM9.

In the printed circuit board 100H of the present embodiment, the alignment mark AM9 may be positioned at the bottom surface solder resist layer 144. For example, the alignment mark AM9 may be formed on the bottom surface solder resist layer 144 through a laser marking process or the like. The alignment mark AM9 may be formed before the solder balls 300 are attached. The alignment mark AM9 is a portion of the bottom surface solder resist layer 144 and may be formed in a notch shape in the bottom surface solder resist layer 144. For example, the alignment mark AM9 may be formed in the solder resist layer 144. For example, the side surfaces and a top surface of the alignment mark AM9 may be formed of the solder resister layer 144.

Figure 15:
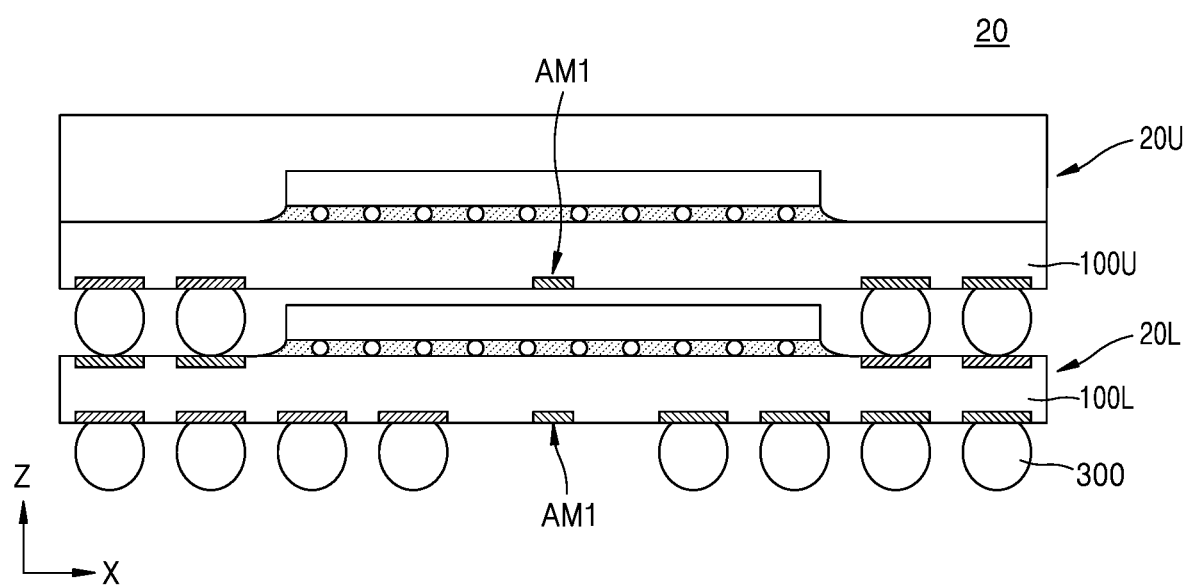
FIG. 15 is a cross-sectional view of a semiconductor package including a printed circuit board according to an embodiment of the inventive concept.

FIG. 15 is a cross-sectional view of a semiconductor package including a printed circuit board according to an embodiment of the inventive concept.

Referring to FIG. 15, a plurality of printed circuit boards 100L and 100U may be applied to a package-on-package type semiconductor package 20.

Printed circuit boards 100, 100A, 100B, 100C, 100D, 100E, 100F, 100G, and 100H described above with reference to FIGS. 3 to 14 may be applied to each of a lower printed circuit board 100L of a lower semiconductor package 20L and an upper printed circuit board 100U of an upper semiconductor package 20U.

In some embodiments, the semiconductor package 20 may not only have a package-on-package structure as illustrated, but also have a package structure like a chip scale package (CSP), die in waffle pack, die in wafer form, chip on board (COB), system in package (SIP), multi-chip package (MCP), wafer-level fabricated package (WFP), and wafer-level processed stack package (WSP). The semiconductor package 20 may include at least one of the printed circuit boards 100L and 100U including the alignment mark AM1.

Figure 16:
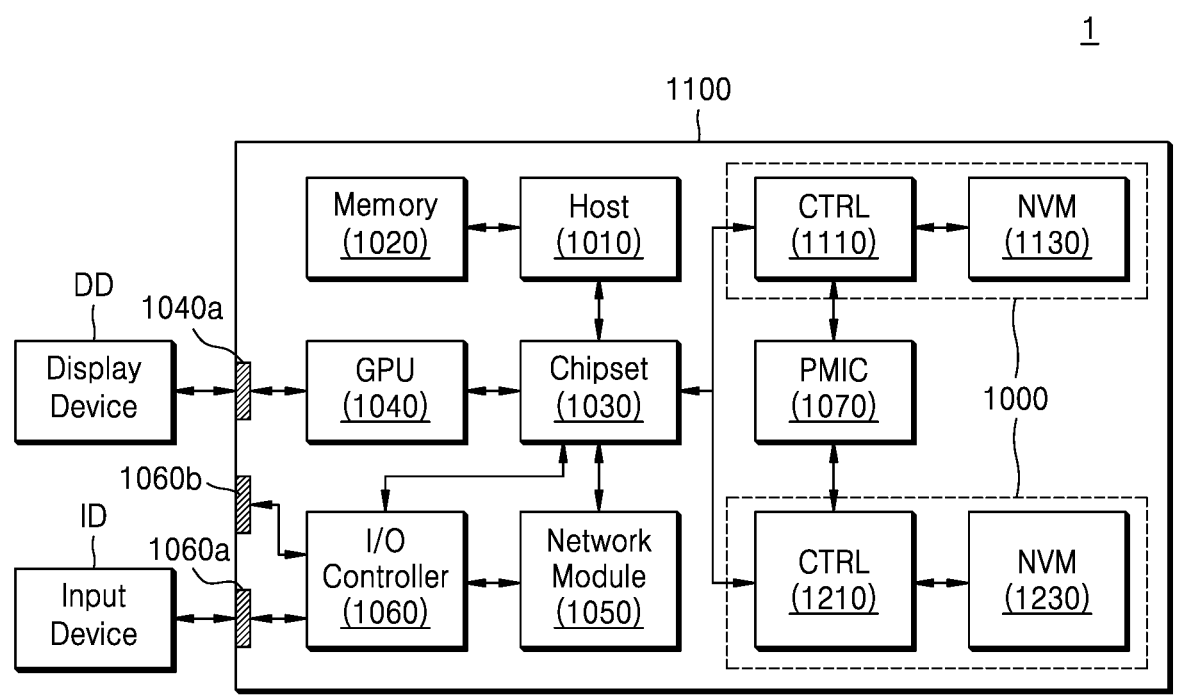
FIG. 16 is a block diagram showing a computing system including a semiconductor package according to an embodiment of the inventive concept.

FIG. 16 is a block diagram showing a computing system including a semiconductor package according to an embodiment of the inventive concept.

Referring to FIG. 16, a computing system 1 may include various pieces of hardware configured as semiconductor packages.

The computing system 1 may include or may be, for example, at least one of a computer, a portable computer, a tablet computer, a workstation, a server, a mobile phone, a digital camera, a device capable of transmitting/receiving information in a wired/wireless environment, and an electronic device constituting a home network system. The computing system 1 may include a main board 1100 having mounted thereon a variety of hardware components, a display device DD, and an input device ID.

The storage device 1000, the host 1010, the memory 1020, the chipset 1030, the graphics processing device 1040, the network module 1050, an input/output controller 1060, a plurality of input/output sockets 1040a, 1060a, and 1060b, and a power management integrated circuit 1070 that are included in the computing system 1 may be mounted in dedicated regions provided on the main board 1100, respectively.

For example, a variety of hardware components demanded to operate the computing system 1 may be mounted on the main board 1100. In some embodiments, the main board 1100 may include respective dedicated regions in which the variety of hardware components like a semiconductor package, a semiconductor device, a passive device, an active device, a control circuit, and/or an electronic circuit may be mounted.

The main board 1100 may include various wires. The various wires may electrically connect the variety of hardware components mounted on the main board 1100 to one another. Various pieces of hardware mounted on the main board 1100 may communicate with one another through the various wires.

The storage device 1000 may include controllers 1110 and 1210 and non-volatile memories 1130 and 1230. Of course, the number of storage devices mounted on the main board 1100 is not limited thereto.

The controllers 1110 and 1210 may control the non-volatile memories 1130 and 1230 in compliance with commands from the host 1010. For example, the controllers 1110 and 1210 may read data stored in the non-volatile memories 1130 and 1230 or program data into the non-volatile memories 1130 and 1230 in compliance with commands from the host 1010. In some embodiments, the controllers 1110 and 1210 may communicate with the host 1010 via the chipset 1030.

The storage device 1000 may be used as a large-capacity storage medium of the computing system 1. In some embodiments, the non-volatile memories 1130 and 1230 may constitute a redundant array of independent disks (RAID).

As described above, the controllers 1110 and 1210 and the non-volatile memories 1130 and 1230 of the storage device 1000 may be mounted on the main board 1100. For example, the storage device 1000 may be configured as an on-board storage medium or an on-board solid state drive (SSD).

The host 1010 may perform various operations demanded for the computing system 1 to operate. For example, the host 1010 may interpret a command input by a user and perform an arithmetic operation and process data based on an interpreted command. The host 1010 may be a central processing unit (CPU).

The memory 1020 may be used as the main memory of the computing system 1. The memory 1020 may include or may be a volatile memory like DRAM, SRAM, and/or double data rate DRAM (DDR DRAM). In some embodiments, the memory 1020 may be mounted on the main board 1100 and may be electrically connected to the host 1010 through a wire provided on the main board 1100.

The chipset 1030 is a device that controls the variety of hardware components included in the computing system 1 in compliance with commands from the host 1010. For example, the chipset 1030 may control the storage device 1000, the graphics processing device 1040, the network module 1050, and the input/output controller 1060 according to commands from the host 1010.

In some embodiments, the chipset 1030 may be mounted on the main board 1100 and may be electrically connected to the variety of hardware components through wires provided on the main board 1100. Also, the chipset 1030 may communicate with the variety of hardware components through a pre-set interface. For example, the pre-set interface may be configured to include at least one of various interfaces like USB, PCI, ATA, SCSI, ESDI, IDE, Firewire, UFS, and I2C.

The graphics processing device 1040 may convert a result of an arithmetic operation or data processed by the host 1010 into image signals. Image signals may be output by the display device DD. In some embodiments, the graphics processing device 1040 may be mounted on the main board 1100 and may be electrically connected to the chipset 1030 and the connector 1040a through wires provided on the main board 1100. In some embodiments, the graphics processing device 1040 may be included in the host 1010. Also, the connector 1040a may be directly connected to the display device DD.

The network module 1050 supports wired or wireless communication to the outside of the computing system 1. For example, the network module 1050 may support wireless communication like CDMA, GSM, WCDMA, TDMA, LTE, Bluetooth, and WiFi. In some embodiments, the network module 1050 may be mounted on the main board 1100 and may be electrically connected to the chipset 1030 through a wire provided on the main board 1100.

The input/output controller 1060 may process information input from the input device ID or the control connectors 1060a and 1060b. The input/output controller 1060 may be electrically connected to the connectors 1060a and 1060b to manage them. In some embodiments, the input/output controller 1060 may be mounted on the main board 1100 and may be electrically connected to the connectors 1060a and 1060b through wires provided on the main board 1100. For example, the connectors 1060a and 1060b may be configured to include at least one of various input/output terminals like a PS2 port, a PCI slot, a DIMM slot, a USB terminal, an RGB port, a DVI port, and an HDMI port.

The power management integrated circuit 1070 may supply power to the variety of hardware components of the computing system 1 based on power supplied from the outside. For example, the power management integrated circuit 1070 may supply power to the storage device 1000. In some embodiments, the power management integrated circuit 1070 may provide dedicated power for the storage device 1000.

While the inventive concept has been particularly shown and described with reference to embodiments thereof, it will be understood that various changes in form and details may be made therein without departing from the spirit and scope of the following claims.

What is claimed is:
1. A printed circuit board comprising:
a substrate base;

a plurality of ball lands arranged on a surface of the substrate base;

a cutting position identification mark identifying a cut corner of the substrate base, the cutting position identification mark disposed on the surface of the substrate base at the cut corner; and an alignment mark disposed on the surface of the substrate base, spaced apart from the ball lands, and exposed by the surface of the substrate base, wherein top surfaces of the ball lands and a top surface of the alignment mark are at substantially the same vertical level and the ball lands and the alignment mark comprise the same material.

2. The printed circuit board of claim 1, wherein the alignment mark is disposed at a center point of the surface of the substrate base and at least partially surrounded by the ball lands.

3. The printed circuit board of claim 2, further comprising a plurality of solder balls attached to ball lands, respectively, wherein a closest distance between the plurality of solder balls attached to the ball lands and the alignment mark is 10 μm or greater.

4. The printed circuit board of claim 1, wherein the alignment mark is a first alignment mark and the printed circuit board comprises a second alignment mark, wherein the first and second alignment marks are respectively located at two corners of the surface of the substrate base at which the cutting position identification mark is not disposed.

5. The printed circuit board of claim 4, wherein the surface of the substrate base has a rectangular shape, and the first and second alignment marks are located at diagonally opposite corners in the rectangular shape of the surface of the substrate base.

6. The printed circuit board of claim 1, wherein a maximum width of the alignment mark is from 30 μm to 300 μm.

7. The printed circuit board of claim 1, wherein the cutting position identification mark has a triangular shape, and
the alignment mark has a cross shape.

8. The printed circuit board of claim 1, wherein the alignment mark is a first alignment mark and the printed circuit board comprises a second alignment mark, wherein the first and second alignment marks identify a center point of a cut printed circuit board individually or in combination.

9. The printed circuit board of claim 1, wherein a top surface of the alignment mark is covered with an organic solderability preservative (OSP).

10. The printed circuit board of claim 1, wherein the alignment mark comprises a light-reflective conductive metal.

11. A printed circuit board for a semiconductor package, the printed circuit board comprising:

a substrate base in which a plurality of wiring layers are vertically stacked;

a plurality of ball lands arranged at a bottommost layer of the wiring layers; and an alignment mark disposed at the bottommost layer of the wiring layers and spaced apart from the ball lands, wherein the alignment mark is exposed by the substrate base, wherein the alignment mark identifies a center point of the printed circuit board relative to the plurality of ball lands, wherein a top surface of the alignment mark comprises the same material as the wiring layers, and wherein the top surface of the alignment mark comprises a resin, a solder resist, or an organic solderability preservative (OSP).

12. The printed circuit board of claim 11, the alignment mark is a first alignment mark and the printed circuit board comprises a second alignment mark, wherein the first alignment mark is located at a center point of a bottom surface of the printed circuit board, and the second alignment mark is located at a cut corner of the bottom surface of the printed circuit board.

13. The printed circuit board of claim 11, wherein the alignment mark has a cross shape, and a maximum width of the alignment mark is from 30 μm to 300 μm.

14. A semiconductor package comprising:

a printed circuit board having a top surface and a bottom surface;

a semiconductor chip mounted on the top surface of the printed circuit board;

a plurality of ball lands located on the bottom surface of the printed circuit board;

a plurality of solder balls attached to the ball lands;

a cutting position identification mark disposed at one corner of the bottom surface of the printed circuit board; and an alignment mark disposed on the bottom surface of the printed circuit board, spaced apart from the ball lands, and exposed by the printed circuit board, and bottom surfaces of the ball lands and a bottom surface of the alignment mark are at substantially the same vertical level and the ball lands and the alignment mark comprise the same material.

15. The semiconductor package of claim 14, wherein alignment mark is disposed at a center point of the bottom surface of the printed circuit board and at least partially surrounded by the solder balls.

16. The semiconductor package of claim 15, wherein a closest distance between the solder balls and the alignment mark is 10 μm or greater.

17. The semiconductor package of claim 14, wherein the alignment mark is a first alignment mark and the semiconductor package further comprises a second alignment mark, wherein the first and second alignment marks are respectively located at two corners of the bottom surface of the printed circuit board at which the cutting position identification mark is not disposed, the bottom surface of the printed circuit board has a rectangular shape, and the first and second alignment marks face each other diagonally in the rectangular shape of the bottom surface of the printed circuit board.

18. The semiconductor package of claim 14, wherein the cutting position identification mark has a triangular shape, and the alignment mark has a cross shape having a maximum width from 30 μm to 300 μm.

* * * * *